United States Patent
Leon

(10) Patent No.: US 8,140,040 B1
(45) Date of Patent: Mar. 20, 2012

(54) METHOD AND APPARATUS FOR A TEMPERATURE COMPENSATED PHASE LOCKED LOOP SUPPORTING A CONTINUOUS STREAM RECEIVER IN AN INTEGRATED CIRCUIT

(75) Inventor: Christopher R. Leon, Irvine, CA (US)

(73) Assignee: Qualcomm Atheros, Inc, San Jose, CA (US)

( * ) Notice: Subject to any disclaimer, the term of this patent is extended or adjusted under 35 U.S.C. 154(b) by 363 days.

(21) Appl. No.: 12/558,388

(22) Filed: Sep. 11, 2009

(51) Int. Cl.
*H04B 1/06* (2006.01)
*H04K 3/00* (2006.01)

(52) U.S. Cl. .......................... 455/260; 327/156; 375/376
(58) Field of Classification Search .................... 455/76, 455/180.3, 260, 262, 265; 327/156; 375/376
See application file for complete search history.

(56) References Cited

U.S. PATENT DOCUMENTS

| | | | |
|---|---|---|---|
| 7,982,551 B2 * | 7/2011 | Iwaida et al. | 331/176 |
| 2005/0226357 A1 * | 10/2005 | Yoshimura | 375/376 |
| 2007/0057736 A1 * | 3/2007 | Baird et al. | 331/16 |
| 2010/0301910 A1 * | 12/2010 | Hu et al. | 327/156 |

* cited by examiner

*Primary Examiner* — Lee Nguyen
(74) *Attorney, Agent, or Firm* — DeLizio Gilliam, PLLC

(57) ABSTRACT

An integrated circuit including a Phase Locked Loop (PLL) configured for use with a continuous stream receiver is disclosed. A control voltage line is configured to deliver a control voltage with a capacitive load delivered by a capacitor array to the control voltage based upon an add signal and a subtract signal. A threshold generator generates a high threshold voltage and a low threshold voltage using and including at least one process dependent resistor and at least two temperature and process dependent current sources. The PLL responds during calibration to the control voltage being above the high threshold voltage by asserting the add signal directing the capacitor array to increase the capacitive load on the control voltage line, and to the control voltage being below the low threshold voltage by asserting the subtract signal to decrease the capacitive load.

15 Claims, 6 Drawing Sheets

METHOD AND APPARATUS FOR A TEMPERATURE COMPENSATED PHASE LOCKED LOOP SUPPORTING A CONTINUOUS STREAM RECEIVER IN AN INTEGRATED CIRCUIT

TECHNICAL FIELD

This invention relates to temperature compensation in a Voltage Controlled Oscillator (VCO) for use in a Phase Locked Loop (PLL) that supports receivers of a continuous stream such as in a Global Positioning System (GPS) receiver or a mobile television receiver.

BACKGROUND OF THE INVENTION

Today it is common for many receivers to use a Phase Locked Loop (PLL) driven internally by a Voltage Controller Oscillator (VCO) to generate a frequency and phase synchronized signal that may be used in a variety of signal generation activities such as down conversion, generating an intermediate frequency signal, isolation of a physical channel and/or demodulation of one of these into an analog or digital channel signal. Integrated circuits in the last few years have come to include these receivers in single components at what has often been a major savings in production cost. While these advances are impressive, there are some situations that must be accounted for. Integrated circuit manufacturing processes have some variations, often referred to as process variations that can affect the operation of the VCO. Additionally, the VCO's performance may vary with the ambient temperature within the integrated circuit. The central problem to be addressed here is how to cost effectively calibrate the VCO to take into account process variations and the ambient temperature of the integrated circuit at calibration time.

While it is well known that VCO's and the PLL's they support can be calibrated at the time of manufacturing and test, these calibration processes add to the manufacturing cost of the integrated circuits. Methods and apparatus are further needed that reduce the manufacturing costs while guaranteeing that these components will operate in their favored control voltage range given the ambient temperature and process variations encountered in making and operating the integrated circuit.

SUMMARY OF THE INVENTION

Embodiments may include an integrated circuit and a Phase Locked Loop (PLL) configured for use with a continuous stream receiver. The PLL may include a control voltage line configured to deliver a control voltage, a capacitor array coupled to the control voltage line and configured to deliver a capacitive load to the control voltage based upon an add signal and a subtract signal, and a threshold generator configured to generate a high threshold voltage and a low threshold voltage using and including at least two process dependent resistors R, at least two process dependent current sources 50 and 52, and at least two temperature and process dependent current sources 54 and 56. The PLL responds to a calibration signal being asserted as follows. The PLL responds to the control voltage being above the high threshold voltage by asserting the add signal directing the capacitor array to increase the capacitive load on the control voltage line. The PLL responds to the control voltage being below the low threshold voltage by asserting the subtract signal directing the capacitor array to decrease the capacitive load.

The threshold generator may include the first process dependent current source 50 coupled to the high threshold voltage VH 40 and/or a second process dependent current source 52 coupled to the low threshold voltage VL 42. The threshold generator may include a first temperature and process dependent current source 54 coupled to the high threshold voltage and/or a second temperature and process dependent current source 56 coupled to the low threshold voltage. At least one of the current sources may include or use a current mirror coupled to another current source.

The threshold generator 80 may include a first process dependent resistor R1 coupled to the high threshold voltage and/or a second process dependent resistor R2 coupled to the low threshold voltage. These resistors may each have the same resistance R.

The threshold generator 80 may include at least one instance of a PMOS transistor, an NMOS transistor, a bipolar transistor and a gallium arsenide transistor.

The PLL may further include a processor 34 that may use the low and high voltage thresholds during calibration to change the capacitive load on the control voltage line 30 that may drive the VCO 24 to create a VCO output. Once calibration is completed, the determinations of the control voltage straying above the high or below the low voltage threshold may be ignored until the PLL operations fail, when the processor may again calibrate the PLL.

The integrated circuit 120 may include the continuous stream receiver 110 configured to use the PLL 100, in particular the receiver may further use the VCO output 29 generated in response to the control voltage presented the capacitive load by the capacitor array and the time-varying capacitance by the varactor 22. The receiver may include the PLL. The continuous stream receiver may support at least one version of a Global Positioning System (GPS) receiver standard and/or a Mobile TV standard.

DETAILED DESCRIPTION

This invention relates to temperature compensation in a Voltage Controlled Oscillator (VCO) for use in a Phase Locked Loop (PLL) that supports receivers of a continuous stream type such as in a Global Positioning System (GPS) receiver or a mobile television receiver. Embodiments may include an integrated circuit and the Phase Locked Loop configured for use with a continuous stream receiver. The PLL may include a control voltage line configured to deliver a control voltage, a capacitor array coupled to the control voltage line and configured to deliver a capacitive load to the control voltage based upon an add signal and a subtract signal, and a threshold generator configured to generate a high threshold voltage and a low threshold voltage using and including two process dependent resistors, two temperature and process dependent current sources, and two process dependent current sources.

Figure 1:
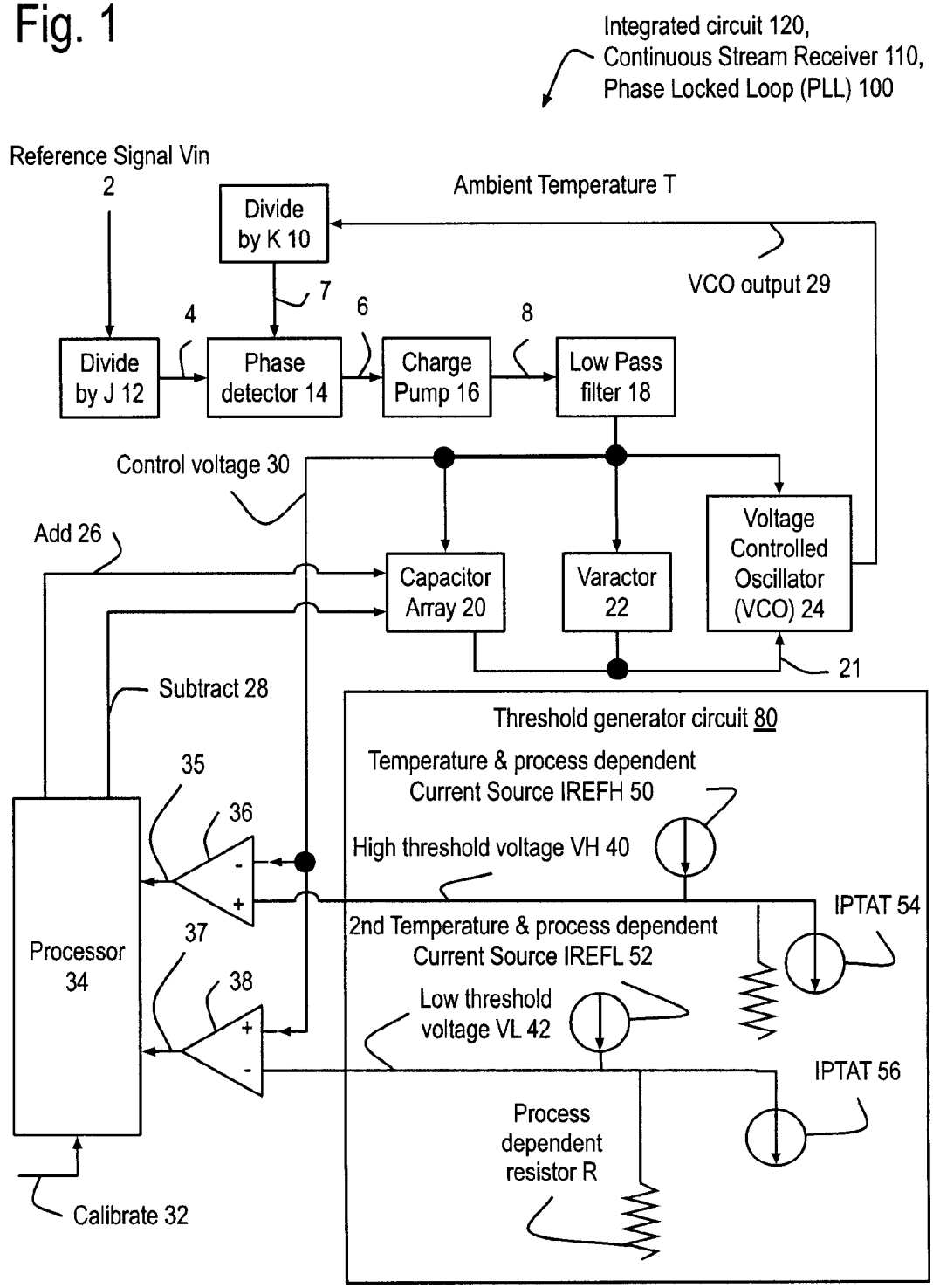
FIG. 1 shows an example of embodiments of an integrated circuit including a Phase Locked Loop (PLL) configured for use with a continuous stream receiver with the PLL including a threshold generator 80 configured to generate a high threshold voltage 40 and a low threshold voltage 42 using and including at least one process dependent resistor R and at least two process dependent current sources 50 and 52 and at least two temperature and process dependent current sources 54 and 56.

Referring to the drawings more particularly by reference numbers, FIG. 1 shows a simplified block diagram of an example of embodiments of the integrated circuit 120 including the PLL 100 configured for use with the continuous stream receiver 110. The PLL may include the control voltage line configured to deliver the control voltage 30, the capacitor array 20 coupled to the control voltage 30 and configured to deliver the capacitive load to the control voltage 30 based upon the add signal 26 and the subtract signal 28, and the threshold generator 80 configured to generate the high threshold voltage 40 and the low threshold voltage 42 using and including two process dependent resistors R, two process dependent current sources 50 and 52, and two temperature and process dependent current sources 54 and 56. A return path 21 may be implemented to tie together the capacitor array 20, the varactor 22 and the VCO 24.

The PLL 100 may respond to a calibration signal 32 being asserted as follows. The PLL responds to the control voltage 30 being above the high threshold voltage 40 by asserting the add signal 26 directing the capacitor array 20 to increase the capacitive load on the control voltage line 30. The PLL responds to the control voltage being below the low threshold voltage 42 by asserting the subtract signal 28 directing the capacitor array 20 to decrease the capacitive load. In an alternative embodiment, the relationship may be reversed such that the response to the control voltage 30 being above the high voltage threshold voltage may be to assert the subtract signal 28 to lower the capacitance of the capacitor array 20 and so on. When the calibration signal is not asserted (referred to hereafter as unasserted), the PLL may respond by unasserting the add signal and the subtract signals, with the capacitive array "remembering" the capacitive load it is to deliver to the control voltage line. The asserting of a signal such as the calibration signal 32, the add signal 26 and/or the subtract signal 28, may make it a Boolean value of 1, or a Boolean value of 0 in other alternative uses of the signal. Different signals may assert with different Boolean values.

The threshold generator 80 may include a first process dependent current source 50 coupled to a first temperature and process dependent current source 54 to generate the high threshold voltage 40 and/or a second process dependent current source 52 coupled to a second temperature and process dependent current source 56 to generate the low threshold voltage 42, with each threshold voltages coupled to process dependent resistors R1 and R2.

The PLL 100 may include a processor 34 that may use the low and high voltage thresholds 40 and 42 during the assertion of the calibration signal 32 to change the capacitive load on the control voltage line 30 that may drive a Voltage Controlled Oscillator (VCO) 24 to create a VCO output 29. Once calibration is completed, the determinations of the control voltage straying above the high voltage threshold 40 or below the low voltage threshold 42 may be ignored until the PLL operations fail, when the processor may again calibrate the PLL 100. The PLL 100 may further include a first comparator 36 configured to receive the control voltage 30 and the high threshold voltage VH 40 to create a first comparator output 35 that may indicate when the control voltage is above the high threshold voltage VH 40. The PLL may also include a second comparator 38 configured to receive the control voltage 30 and the low threshold voltage VL 42 to create a second comparator output 37 that may indicate when the control voltage 30 is below the low threshold voltage VL 42. As used herein, one quantity or measurement may be above a second when it is relatively greater than the second. Alternatively, in certain circumstances, the first may be above the second when it is relatively greater than or equal to the second. Also, a first quantity may be below a second whenever the second is relatively above the first.

The VCO 24 may generate a VCO output 29 having a frequency that varies in response to changes in a control voltage 30. The frequency of the VCO output may determined in part by a capacitance within the VCO 24 as shown, but may also be determined by a combination of inductance and capacitance. In some VCOs, capacitors may be switched in and out of coupling to the control voltage line to cause oscillation at a selected frequency value referred to herein as the FVCO. In other VCOs, a voltage controlled capacitor, that is, a capacitor whose value of capacitance changes in response to an applied voltage, is used to set FVCO. Alternatively, a combination of a voltage controlled capacitor and fixed-value switched capacitors may be used as shown in FIG. 1.

The PLL 100 may receive a reference signal Vin 2 presented to a divide by J circuit 12 to create a divided input waveform 4. The VCO output 29 may be presented to a divide by K circuit 10 to create a divided VCO output waveform 7. The PLL 100 may include a phase detector 14, a low pass filter 18, and the VCO 24 may be connected in a negative feedback circuit. The phase detector 14 compares the phase of the divided input waveform 4 to the phase of the divided VCO output waveform 7 and outputs a compensation signal 6 proportional to the phase difference between the divided input waveform 4 and the divided VCO output waveform 7. The compensation signal may drive a charge pump 8 to create a pumped compensation signal 8 to the low pass filter 18, which reduces the amplitudes of some high frequency components of the signal to create the control voltage 30. The charge pump 16 may act as a frequency detector in some situations. The control voltage 30 may stimulate the VCO 24 to adjust the FVCO of its VCO output 29. Feedback within the PLL 100 causes the VCO control voltage 30 to change until FVCO is the same as the frequency of the divided input waveform 4.

The PLL 100 is phase locked when the frequency FVCO of the VCO output 29 equals the frequency of the divided input waveform 4. The process of bringing the FVCO to equal the divided input waveform frequency is referred to as "capture", and the maximum frequency separation between the PLL input waveform frequency and the VCO output waveform frequency over which phase lock can be achieved is referred to as the "capture range". The capture range is determined in part by the range of the control voltage 30 supporting linear operation of the VCO 24 and further corresponding to linear operation of the varactor 22. A VCO operating outside its limits of linear operation, for example as a result of a VCO control signal having an amplitude that drives the VCO out of its linear range or because a change in the ambient temperature T changes the capacitance in the VCO, generally causes a PLL to fail in capturing the frequency, that is, the PLL fails to phase lock.

The varactor 22 may be implemented as a diode that may be used as a voltage controlled capacitor, which is sometimes called a varicap. The varactor is operating linearly when a change in control voltage 30 produces a proportional change in the varactor's capacitance. However, for a sufficiently large change in applied voltage, the varactor will not tend to produce that proportional change in its capacitance.

The VCO 24 is operating linearly when a change in the control voltage 30 produces a corresponding proportional change in the frequency FVCO of its VCO output 29. A VCO operating outside its linear operating region may not produce the proportional change in FVCO in response to the change in control voltage. Linear operation of the VCO using the varactor 22 to set FVCO requires that the varactor is also operating linearly.

A change in the ambient temperature T in the VCO 24 can also change FVCO for its VCO output 29. The operating temperature range for the VCO and also for the varactor 22 to operate linearly may be between minus forty degrees and ninety degrees Celsius, for example.

The integrated circuit 120 may include the continuous stream receiver 110 configured to use the PLL 100, in particular the receiver may further use the VCO output 29 generated in response to the control voltage 30 presented the capacitive load by the capacitor array 20 and the time-varying capacitance by a varactor 22. The continuous stream receiver 110 may support at least one version of a Global Positioning System (GPS) receiver standard and/or a Mobile TV standard.

Figure 2:
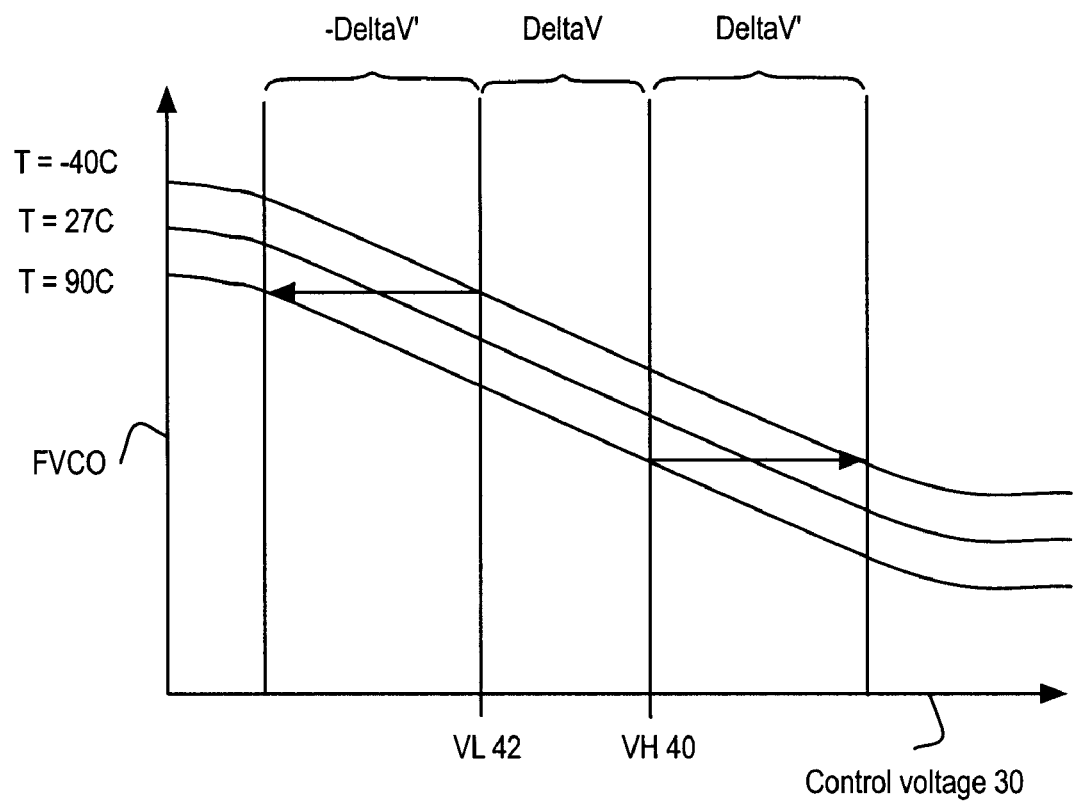
FIG. 2 shows a simplified plot of three ambient temperatures T of −40 degrees Celsius (C) referred to as 'cold', 27 degrees C. referred to as 'room' and 90 degrees C. referred to as 'hot' showing the FVCO frequency of the VCO output of FIG. 1 vertically against the control voltage range horizontally. The plot shows the location of the window of calibration of the VCO, where the window is between VL 42 and VH 40, which moves according to the ambient temperature and it's location is optimized such that the VCO operates in it's linear region. If the temperature is hot the calibration window will be on the left side, if it's at room temperature the calibration window is at the middle, while for cold it will reside towards the right side of the figure.

FIG. 2 shows a simplified plot of three ambient temperatures T of −40 degrees Celsius (C) referred to as 'cold', 27 degrees C. referred to as 'room' and 90 degrees C. referred to as 'hot' showing the FVCO frequency of the VCO output of FIG. 1 vertically against the control voltage range horizontally. The plot shows the location of the window of calibration of the VCO, where the window is between VL 42 and VH 40, which moves according to the ambient temperature and it's location is optimized such that the VCO operates in it's linear region. If the temperature is hot the calibration window will be on the left side, if it's at room temperature the calibration window is at the middle, while for cold it will reside towards the right side of the figure. Note that in some embodiments the linear range may be further modified to incorporate a guard band to account for the aging of the integrated circuit 120.

Figure 3:
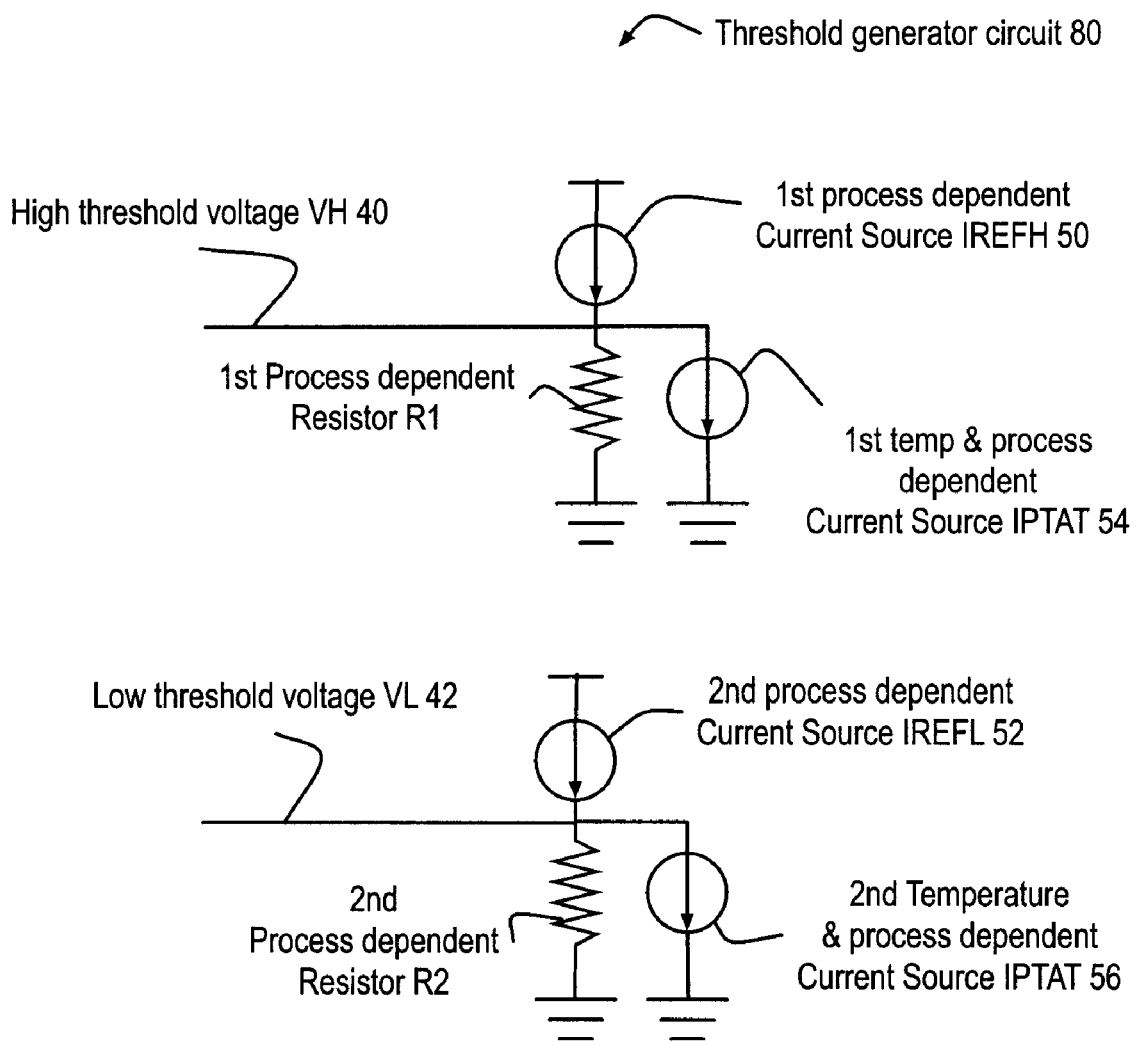
FIG. 3 shows some exemplary details of the threshold generator 80 of FIG. 1 that may include a first process dependent current source 50 coupled to a first temperature and process dependent current source 54 to generate the high threshold voltage VH 40 and/or a second process dependent current source 54 coupled to a second temperature and process dependent current source 56 to generate the low threshold voltage VL 42, with each of the threshold voltages coupled to separate process dependent resistors R1 and R2.

FIG. 3 shows as example of the threshold generator 80 of FIG. 1 that may include a first temperature and process dependent current source 54 coupled to the high threshold voltage 40 and/or a second temperature and process dependent current source 56 coupled to the low threshold voltage 42. In operation, the first temperature and process dependent current source 54 may contribute to producing the high threshold voltage 40 and/or the second temperature and process dependent current source 56 may contribute to producing the low threshold voltage 42

The threshold generator 80 may include a first process dependent resistor R1 coupled to the high threshold voltage 40 and/or a second process dependent resistor R2 coupled to the low threshold voltage 42 as shown in FIG. 3.

By way of example, consider the first and second temperature and process dependent current sources 54 and 56 to generate essentially the same current IPTAT at a given ambient temperature T. The process dependent resistors R1 and R2 may each have the same resistance R. The high threshold voltage VH 40 may have approximately the following relationship to its current sources IREFH and IPTAT and the process dependent resistor R1:

$$VH = (IREFH - IPTAT) * R \qquad (1)$$

Similarly, for the low threshold voltage VL 42 has the following approximate relationship for its current sources IREFL and IPTAT and the process dependent resistor R2:

$$VL = (IREFL - IPTAT) * R \qquad (2)$$

Now define DeltaV=VH−VL and choose VH, VL so that DeltaV' is a change in the high threshold voltage VH that is mirror symmetric from the room temperature of 27 degrees Celsius to either the hot temperature of 90 degrees or the cold temperature of −40 degrees. These definitions and choices are summarized in Table One below:

| Ambient Temperature T | High threshold voltage 40 | Low threshold voltage 42 |
|---|---|---|
| Cold (−40 degrees C.) | VH + DeltaV' | VH − DeltaV + DeltaV' |
| Room (27 degrees C.) | VH | VH − DeltaV |
| Hot (90 degrees C.) | VH − DeltaV' | VH − DeltaV − DeltaV' |

Table One: showing the relationship between the ambient temperature T, the high threshold voltage 40, the low threshold voltage 42, the DeltaV and the DeltaV' of FIG. 2.

Subtracting the second equation from the first gives DeltaV=VH−VL with $$DeltaV = (IREFH - IREFL) * R \qquad (3)$$

This operating window between VH and VL moves to higher or lower voltages within the operating temperature range by the following amount:

$$DeltaV' = IPTAT * R \qquad (4)$$

Given these formulas, definitions, a specific manufacturing process for the integrated circuit 120, the desired range of the ambient temperature T, and the range of the output frequency FVCO for the VCO output 29, one may derive at least a first order approximation of the threshold generator 80 as shown in FIG. 3 which may be further determined to industrial standards without undue experimentation. In certain embodiments, the above analysis may be incrementally modified to account for a high ambient temperature T tending to become cooler over time, such as when the integrated circuit 120 is taken from a hot summer day into a cooler office building. Similarly, the above analysis may be incrementally modified to account for a low ambient temperature T tending to become hotter over time, such as when the integrated circuit 120 is taken from a cold winter day into a heated room.

Figure 4:
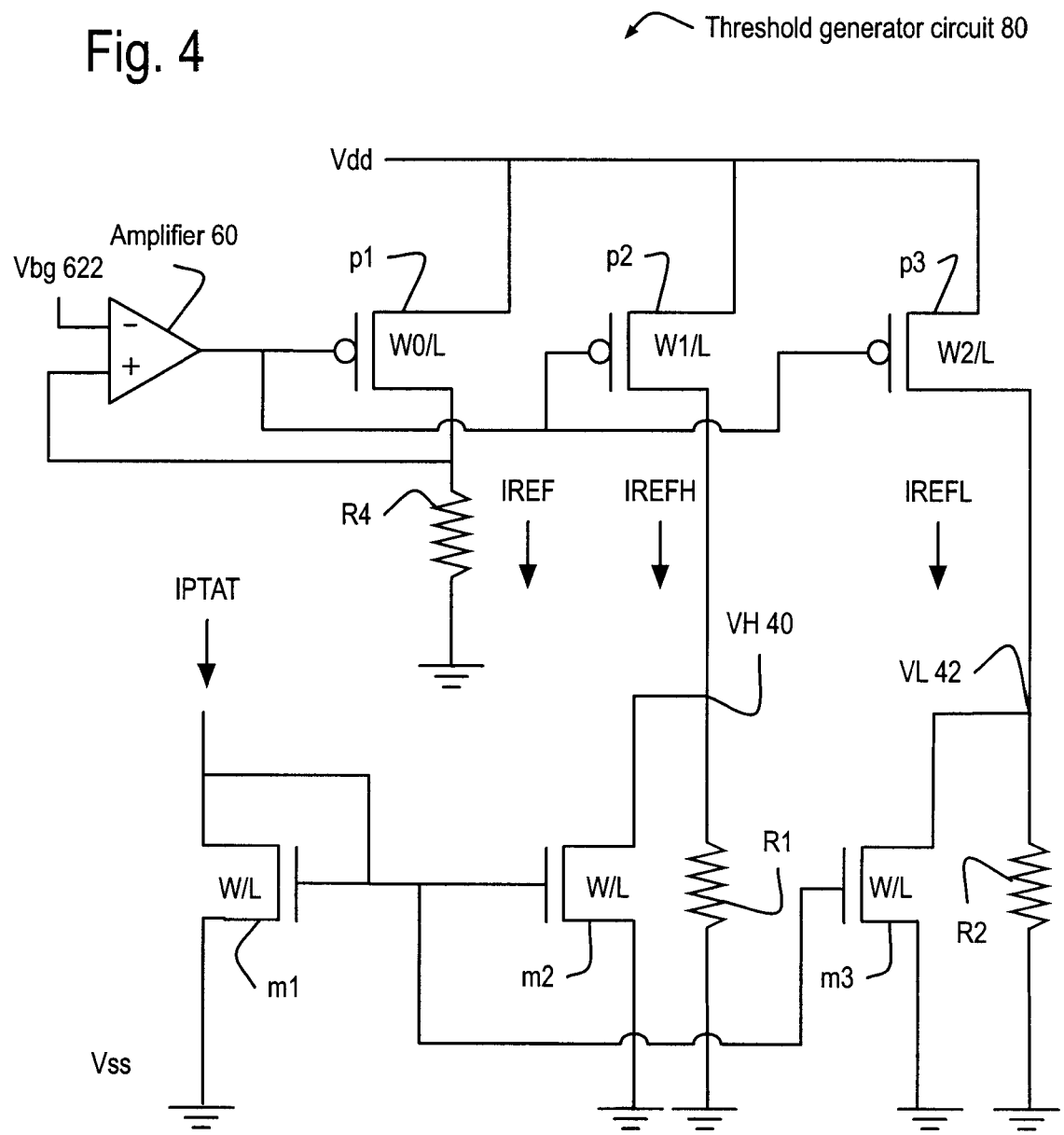
FIG. 4 shows an example of some details of the threshold generator circuit, with a reference voltage such as a bandgap voltage Vbg being presented as one of two differential inputs to an amplifier and at least one of the current sources for IPTAT is implemented with a current mirror.

One or more of the current sources 50, 52, 54 or 56 may be a current mirror coupled to one of the other current sources as shown in FIG. 4.

FIG. 4 shows an example of the threshold generator circuit 80, with a bandgap voltage Vbg being presented as one of two differential inputs to an amplifier 60, whose other input receives the feedback of its output. The amplifier 60 output is presented to the gates of the p1, p2 and p3 PMOS transistors. The sources of the p1, p2 and p3 PMOS transistors are all tied to a first voltage rail labeled as Vdd. The drain of the p1 PMOS transistor is coupled through the R4 resistor to a second voltage rail treated as a ground and referred to as Vss.

The amplifier 60, the p1 PMOS transistor and the R4 resistor collectively act as a current source for the IREF current, which has the following approximate relationship with the band gap voltage Vbg:

$$IREF = Vbg/R4 \quad (5)$$

The temperature and process dependent current source 54 may be implemented as a current mirror for such a current IPTAT that may be produced somewhere else. Here IPTAT is presented to the drain and gate of the m1 NMOS transistor, whose source is coupled to the second voltage rail or ground Vss. IPTAT is then the current through the m2 and m3 NMOS transistors, each of which has its source tied to the ground Vss. In certain embodiments, assume that the R1 and R2 process dependent resistors are both instances of the R1 process resistor. The first process dependent current source 50 includes the p2 PMOS transistor, the m2 NMOS transistor and the first process dependent resistor R1, which collectively generate IREFH based upon the relationship $$IREFH = IREF*W1/W0 \quad (6)$$

where the lengths of these transistors are essentially the same and labeled L while the width of the p1 PMOS transistor is W0, the width of the p2 PMOS transistor is W1. The first process dependent current source 50 also generates the high threshold voltage VH 40 based upon the relationship $$VH = (IREFH - IPTAT)*R \quad (7)$$

The second process dependent current source 52 includes the p3 PMOS transistor, the m3 NMOS transistor and the second process dependent resistor R2 to collectively create the IREFL current based upon the relationship $$IREFL = IREF*W2/W0 \quad (8)$$

where the width of the p3 PMOS transistor is W2 and the widths of the m1, m2 and m3 NMOS transistors are all W. This same current source operates to create the low threshold voltage VL 42 based upon the relationship $$VL = (IREFL - IPTAT)*R \quad (9)$$

Now the previous circuit analysis for FIG. 3 based upon FIG. 2 may be applied to allow one of skill in the art to create a first order approximation of this circuit, which can then be implemented to industrial standards without undue experimentation.

Figure 5:
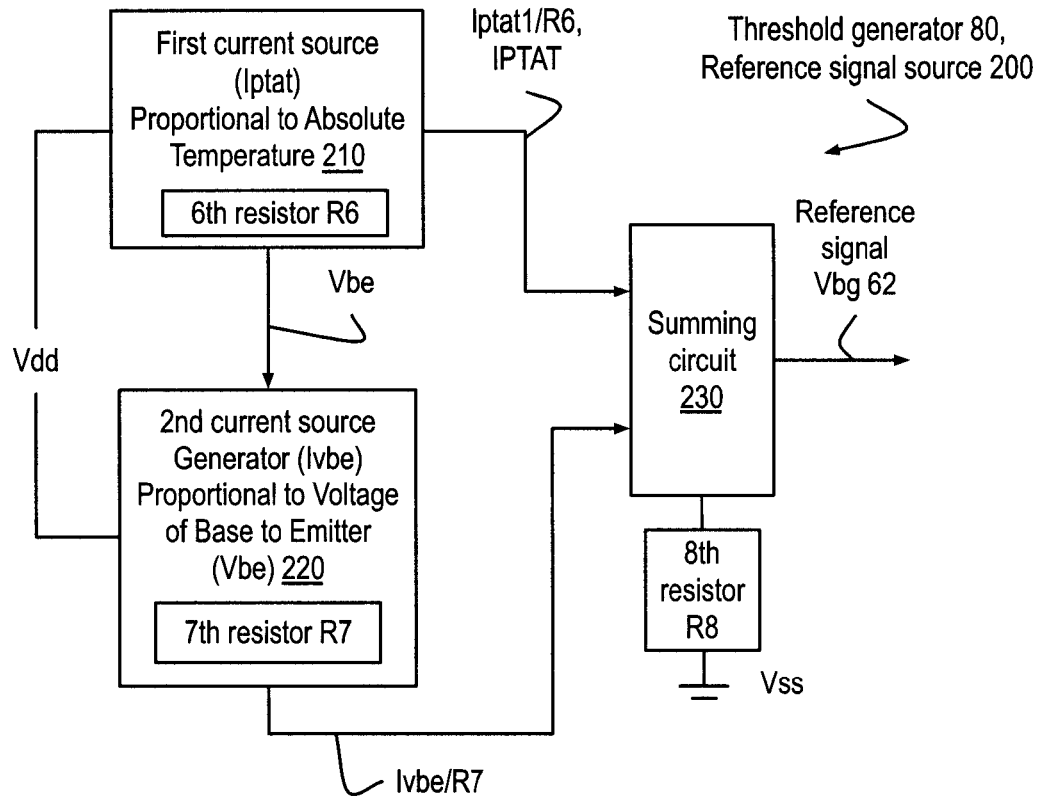
FIG. 5 shows a simplified block diagram of a reference signal generator that may provide the bandgap voltage reference signal as well as a temperature and process dependent current source of FIG. 4 where this reference signal generator may be coupled to the threshold generator or included in the threshold generator.

FIG. 5 shows a simplified block diagram of a reference signal source 200 that may be coupled to the threshold generator 80 or may be included in it in other embodiments. The reference signal source 200 may provide the current dependent and process independent current IPTAT as shown in FIG. 4 as well as the band gap voltage Vbg 62 as a reference signal. The reference signal 62 may result from summing 230 a first temperature dependent current Iptat1 scaled by a sixth resistor R6 from a current source 210 and a current proportional to the voltage of the base to emitter of a bipolar transistor scaled by a seventh resistor R7 from the current source 220. The summing circuit 230 may use a resistive path to ground through the eighth resistor R8.

The threshold generator 80 may include at least one instance of a PMOS transistor such as p1 in FIG. 4, an NMOS transistor such as m1, a bipolar transistor and/or a gallium arsenide transistor, which have not been shown.

Figure 6:
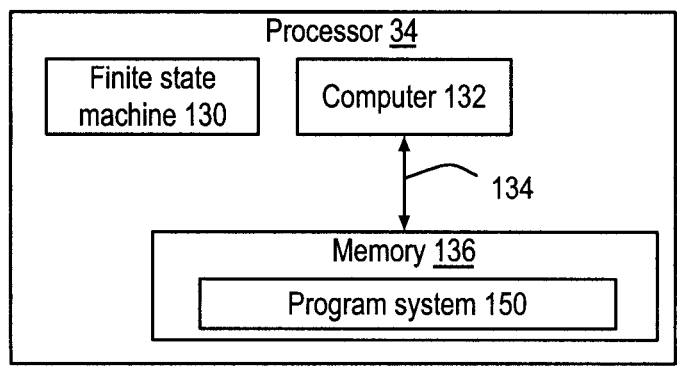
FIG. 6 shows a block diagram of the processor 34 of FIG. 1 that may include at least one instance of a finite state machine and/or at least one instance of a computer accessibly coupled to a memory including a program system for instructing the computer to operate at least part of the PLL in terms of calibrating the capacitive load of the capacitor array on the control voltage line.

FIG. 6 shows the processor 34 may including at least one instance of a finite state machine 130 and/or at least one instance of a computer 132 accessibly coupled 134 to a computer readable memory 136 and instructed by a program system 150 to operate the processor.

As used herein, any computer 132 includes at least one data processor and at least one instruction processor instructed by a program system 150, where each of the data processors is instructed by at least one of the instruction processors.

As used herein, a finite state machine 130 receives at least one input, maintains and updates at least one state and generates at least one output based upon the value of at least one of the inputs and/or the value of at least one of the states.

Figure 7:
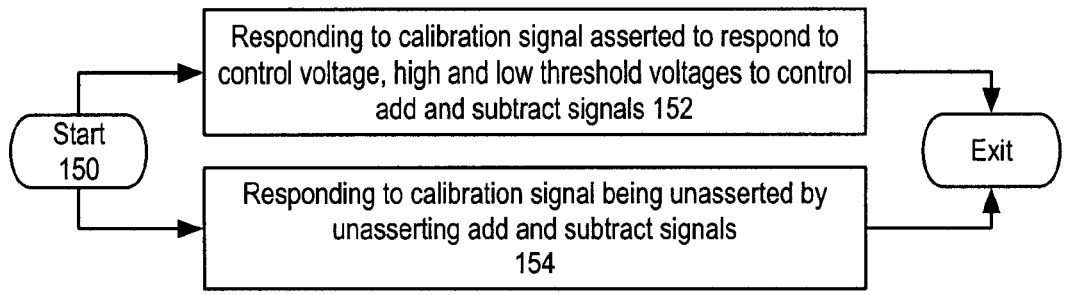
FIG. 7 shows a flow chart of some details of the program system responding to the calibration signal being asserted or unasserted.
Figure 8:
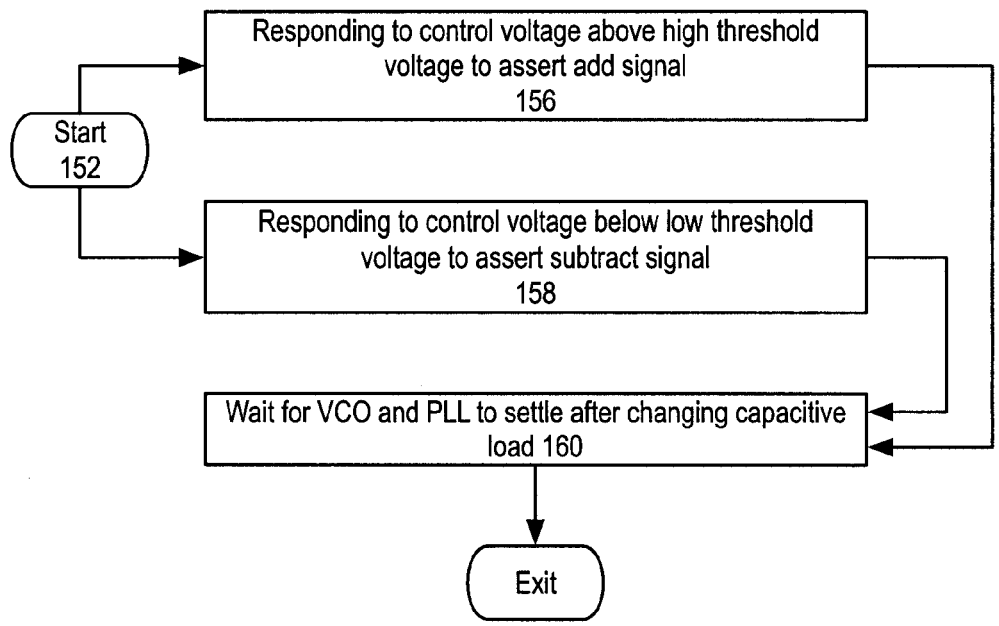
FIG. 8 shows a flow chart of some details of the program system directing the operations of the PLL to respond to the calibration signal being asserted.

FIGS. 7 and 8 show flowcharts of various details of the program system 150 implementing various operational embodiments of the access point. These flowcharts show some method embodiments, which may include arrows signifying a flow of control, and sometimes data, supporting various implementations. These may include a program operation, or program thread, executing upon the computer 132 or states of a finite state machine 130. Each of these program steps may at least partly support the operation to be performed. The operation of starting a flowchart refers to entering a subroutine or a macro instruction sequence in the computer or of a possibly initial state or condition of the finite state machine. The operation of termination in a flowchart refers to completion of those operations, which may result in a subroutine return in the computer or possibly return the finite state machine to a previous condition or state. The operation of terminating a flowchart is denoted by a rounded box with the word "Exit" in it.

FIG. 7 shows some details of the program system 150 of FIG. 6 including at least one of the following. Program step 152 supports responding to the calibration signal 32 being asserted to respond to the control voltage 30, the high threshold voltage 40 and the low threshold voltage 42 to control the add signal 26 and the subtract signal 28. Program step 154 supports responding to the calibration signal being unasserted to unassert the add signal and the subtract signal.

FIG. 8 shows some details of the program step 152 responding to the calibration signal 32 being asserted. Program step 156 supports responding to the control voltage 30 being above the high threshold voltage VH 40 to assert the add signal 26. Program step 158 supports responding to the control voltage 30 being below the low threshold voltage VL 42 to assert the subtract signal 28. Both of these program steps may proceed to program step 160 which supports waiting for the VCO 24 and the PLL 100 to settle after changing the capacitive load in the capacitor array 20.

Program step 156 may further use the first comparator output 35 to determine when to respond to the control voltage 30 being above the high threshold voltage VH 40.

Program step 158 may further use the second comparator output 37 to determine when to respond to the control voltage 30 being below the low threshold voltage VL 42.

The preceding embodiments provide examples and are not meant to constrain the scope of the following claims.

What is claimed is:

1. An integrated circuit (120), comprising:
   a Phase Locked Loop (PLL) (100) configured for use with a continuous stream receiver (110) comprising
   a control voltage line configured to deliver a control voltage (30);
   a capacitor array (20) coupled to said control voltage line and configured to deliver a capacitive load to said control voltage based upon an add signal (26) and a subtract signal (28);
   a threshold generator (80) configured to generate a high threshold voltage (40) and a low threshold voltage (42) based upon an ambient temperature (T) in said PLL and including at least one process dependent resistor (R) and at least two process dependent current sources (50, 52) all responding to said ambient temperature and used to generate said high threshold voltage and said low threshold voltage;
   with said PLL configured to respond to a calibration signal (32) being asserted
   by responding to said control voltage above said high threshold voltage by asserting said add signal to direct said capacitor array to increase said capacitive load and
   by responding to said control voltage below said low threshold voltage by asserting said subtract signal to direct said capacitor array to decrease said capacitive load.

2. The integrated circuit of claim 1, wherein said threshold generator includes at least one member of the group consisting of
   a first of said process dependent current sources (50) coupled to said high threshold voltage; and
   a second of said process dependent current sources (52) coupled to said low threshold voltage.

3. The integrated circuit of claim 1, wherein said threshold generator further includes at least one member of the group consisting of
   a first temperature and process dependent current source (54) coupled to said high threshold voltage; and
   a second temperature and process dependent current source (56) coupled to said low threshold voltage.

4. The integrated circuit of claim 3, wherein one of said temperature t and process dependent current sources (54, 56) is implemented as a current mirror coupled to the other of said current sources (54,56).

5. The integrated circuit of claim 1, wherein said threshold generator further includes at least one member of the group consisting of
   a first of said process dependent resistors (R1) coupled to said high threshold voltage; and
   a second of said process dependent resistors (R2) coupled to said low threshold voltage.

6. The integrated circuit of claim 5, wherein said first of said processor dependent resistors and said second of said process dependent resistors, each have the same resistance (R5).

7. The integrated circuit of claim 1, wherein said threshold generator includes at least one instance of at least one member of the group consisting of: a PMOS transistor, an NMOS transistor, a bipolar transistor and a gallium arsenide transistor.

8. The integrated circuit of claim 1, wherein said processor comprises at least one instance of at least one member of the group consisting of: a finite state machine and a computer accessibly coupled to a memory, said memory including a program system configured to instruct said computer.

9. The integrated circuit of claim 8, wherein said program system includes at least one of the program steps of:
   responding to said calibration signal being asserted to respond to said control voltage, said high threshold voltage and said low threshold voltage to control said add signal and to control said subtract signal, further comprising the program steps of
      responding to a first comparator output generated by a first comparator when said control voltage is above said high threshold voltage to assert said add signal;
      responding to a second comparator output generated by a second comparator in response to said control voltage and said low threshold voltage to assert said subtract signal; and
   responding to said calibration signal being unasserted by unasserting said add signal and by unasserting said subtract signal.

10. The integrated circuit of claim 1, further comprising said continuous stream receiver configured to use said PLL.

11. The integrated circuit of claim 10, wherein said continuous stream receiver supports at least one version of at least one member of the group consisting of: a Global Positioning System (GPS) receiver standard and a mobile TV communications protocol.

12. A method, comprising the step of:
   operating a Phase Locked Loop (100) for a continuous stream receiver (110) in an integrated circuit (100) at an ambient temperature (T), further comprising the steps of:
   a Voltage Controlled Oscillator (24) responding to a control voltage (30) presented a capacitive load by a capacitor array (20) and a time-varying capacitance by a varactor (22);
   a threshold generator circuit (80) compensating for said ambient temperature to generate a high threshold voltage (40) and a low threshold voltage (42), further comprising the steps of
   operating a first process dependent current source (50) to at least partly create said high threshold voltage in response to said ambient temperature;
   operating a second process dependent current source (52) to at least partly create said low threshold voltage in response to said ambient temperature;
   operating a first temperature and process dependent current source (54) to at least partly create said high threshold voltage in response to said ambient temperature;
   operating a second temperature and process dependent current source (56) to at least partly create said low threshold voltage in response to said ambient temperature; and
   responding to at least one process dependent resistor (R) to further create said high threshold voltage and said low threshold voltage;
   wherein the step operating said Phase Locked Loop (PLL) further comprises the step of:
   responding to a calibration signal (32), consisting of the steps of:

responding to said control voltage above said high threshold voltage by asserting an add signal coupled to said capacitor bank to increase said capacitive load; and responding to said control voltage below said low threshold voltage by asserting a subtract signal coupled to said capacitor bank to decrease said capacitive load.

13. The method of claim 12, wherein the step operating said PLL further comprises the step of operating said Voltage Control Oscillator (VCO) to create a VCO output (29) in response to said control voltage, said capacitive load and said ambient temperature.

14. The method of claim 13, further comprising the step:
operating said continuous stream receiver based upon said VCO output.

15. The method of claim 12, wherein said continuous stream receiver supports at least one version of at least one member of the group consisting of: a Global Positioning System (GPS) receiver standard and a mobile TV communications protocol.

* * * * *